United States Patent
Berkel et al.

(10) Patent No.: US 11,160,160 B1
(45) Date of Patent: Oct. 26, 2021

(54) PCB FOR BARE DIE MOUNT AND PROCESS THEREFORE

(71) Applicant: Multek Technologies Limited, Irvine, CA (US)

(72) Inventors: Jan Hendrik Berkel, Rijssen (NL); Todd Robinson, San Mateo, CA (US)

(*) Notice: Subject to any disclaimer, the term of this patent is extended or adjusted under 35 U.S.C. 154(b) by 0 days.

(21) Appl. No.: 16/986,497

(22) Filed: Aug. 6, 2020

(51) Int. Cl.
| | |
|---|---|
| H05K 1/02 | (2006.01) |
| H01L 25/065 | (2006.01) |
| H01L 23/367 | (2006.01) |
| H05K 13/04 | (2006.01) |
| H01L 23/00 | (2006.01) |
| H01L 21/50 | (2006.01) |
| H01L 23/488 | (2006.01) |

(52) U.S. Cl.
CPC .......... *H05K 1/0203* (2013.01); *H01L 21/50* (2013.01); *H01L 23/367* (2013.01); *H01L 23/488* (2013.01); *H01L 24/03* (2013.01); *H01L 24/05* (2013.01); *H01L 25/0657* (2013.01); *H05K 13/0465* (2013.01)

(58) Field of Classification Search
CPC .......................................... H05K 1/0203–021
See application file for complete search history.

(56) References Cited

U.S. PATENT DOCUMENTS 10,499,500 B2  12/2019  Berkel et al.
2017/0141744 A1*  5/2017  Kim .................. H03F 3/211

* cited by examiner

*Primary Examiner* — Jeremy C Norris
(74) *Attorney, Agent, or Firm* — Carlson, Caspers, Vandenburgh & Lindquist, P.A.

(57) ABSTRACT

Embodiments for a circuit board comprising a plurality of electrically conductive layers and a plurality of electrically non-conductive layers in a laminated stack are provided. The laminated stack defines a front face and a back face. A thermal conductive heat body extends from a die bond pad on the front face to an electrically conductive layer on the back face. The die bond pad is configured for a bare die to be mounted thereon. A bonding agent disposed around the thermal conductive heat body adhering the thermal conductive heat body to walls of an opening of the laminated stack and at least one of the plurality of electrically non-conductive layers are a monolithic structure. A plurality of wire bond pads on the front face adjacent to the die bond pad have a surface finish material thereon. The surface finish material is configured for wire bonding thereto.

21 Claims, 17 Drawing Sheets

PCB FOR BARE DIE MOUNT AND PROCESS THEREFORE

BACKGROUND

A packaged integrated circuit (IC) includes one or more semiconductor dies that are attached to a chip carrier and encapsulated. The chip carrier can include a lead frame and/or metal flange for signal connection and heat dissipation of the dies. The packaged IC can then be mounted to a printed circuit board (PCB). The packaged IC can be mounted to the PCB via conductive adhesive or soldering methods.

Recently, bare dies (i.e., dies that have not been mounted to a carrier or encapsulated) have been attached directly to a PCB. To provide heat dissipation from the die, the regular copper layers in the PCB can have increased thickness and/or one or more micro-vias can be included from the bond pad of the die to the backside of the PCB. In other examples, a thermal conductive heat body is included in the PCB. The thermal conductive heat body is a larger heat conducting block that extends from the bond pad of the die to the backside of the PCB.

During manufacture of such a PCB, the thermal conductive heat body is added after final lamination of the PCB layers. After final lamination of the layers in the PCB, an opening can be formed in the backside of the PCB for the thermal conductive heat body. The thermal conductive heat body and an adhesive are placed in the opening and cured to secure the thermal conductive heat body into the PCB.

BRIEF DESCRIPTION

Embodiments for a circuit board comprising a plurality of electrically conductive layers and a plurality of electrically non-conductive layers in a laminated stack are provided. The laminated stack defines a front face and a back face. A thermal conductive heat body extends from a die bond pad on the front face to an electrically conductive layer on the back face. The die bond pad is configured for a bare die to be mounted thereon. A bonding agent disposed around the thermal conductive heat body adhering the thermal conductive heat body to walls of an opening of the laminated stack and at least one of the plurality of electrically non-conductive layers are a monolithic structure. A plurality of wire bond pads on the front face adjacent to the die bond pad have a surface finish material thereon. The surface finish material is configured for wire bonding thereto.

Embodiments for a method of fabricating a circuit board are also provided. The method includes forming a stack-up with an opening for a thermal conductive heat body. The stack-up includes a plurality of electrically conductive layers and a plurality of electrically non-conductive layers. The plurality of electrically non-conductive layers include at least one layer of prepreg. The thermal conductive heat body is inserted into the opening. The stack-is laminated with the thermal conductive heat body in the opening forming a laminated stack defining a front face and a back face. Resin in the at least one layer of prepreg flows between the thermal conductive heat body and walls of the opening to adhere the thermal conductive heat body into the opening. The front face and the back face are plated with an electrically conductive plating to couple the thermal conductive heat body to one or more of the plurality of conductive layers. A plurality of wire bond pads on the front face adjacent to the thermal conductive heat body are plated with a surface finish material that is configured for wire bonding thereto.

Embodiments for another circuit board having a plurality of electrically conductive layers and a plurality of electrically non-conductive layers in a laminated stack are also provided. The circuit board defines a front face and a back face. A thermal conductive heat body extends from a die bond pad on the front face to an electrically conductive layer on the back face. The die bond pad is configured for a bare die to be mounted thereon. A bonding agent disposed around the thermal conductive heat body adhering the thermal conductive heat body to walls of an opening of the laminated stack and at least one of the plurality of electrically non-conductive layers are a monolithic structure. A bare die is adhered to the first bond pad.

Embodiments for another method of fabricating a circuit board are also provided. The method includes forming a stack-up with an opening for a thermal conductive heat body. The stack-up includes a plurality of electrically conductive layers and a plurality of electrically non-conductive layers. The plurality of electrically non-conductive layers include at least one layer of prepreg. The thermal conductive heat body is inserted into the opening. The stack-up is laminated with the thermal conductive heat body in the opening forming a laminated stack defining a front face and a back face. Resin in the at least one layer of prepreg flows between the thermal conductive heat body and walls of the opening to adhere the thermal conductive heat body into the opening. The front face and the back face are plated with an electrically conductive plating to couple the thermal conductive heat body to one or more of the plurality of conductive layers. A bare die is mounted to a die bond pad defined over the thermal conductive heat body.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
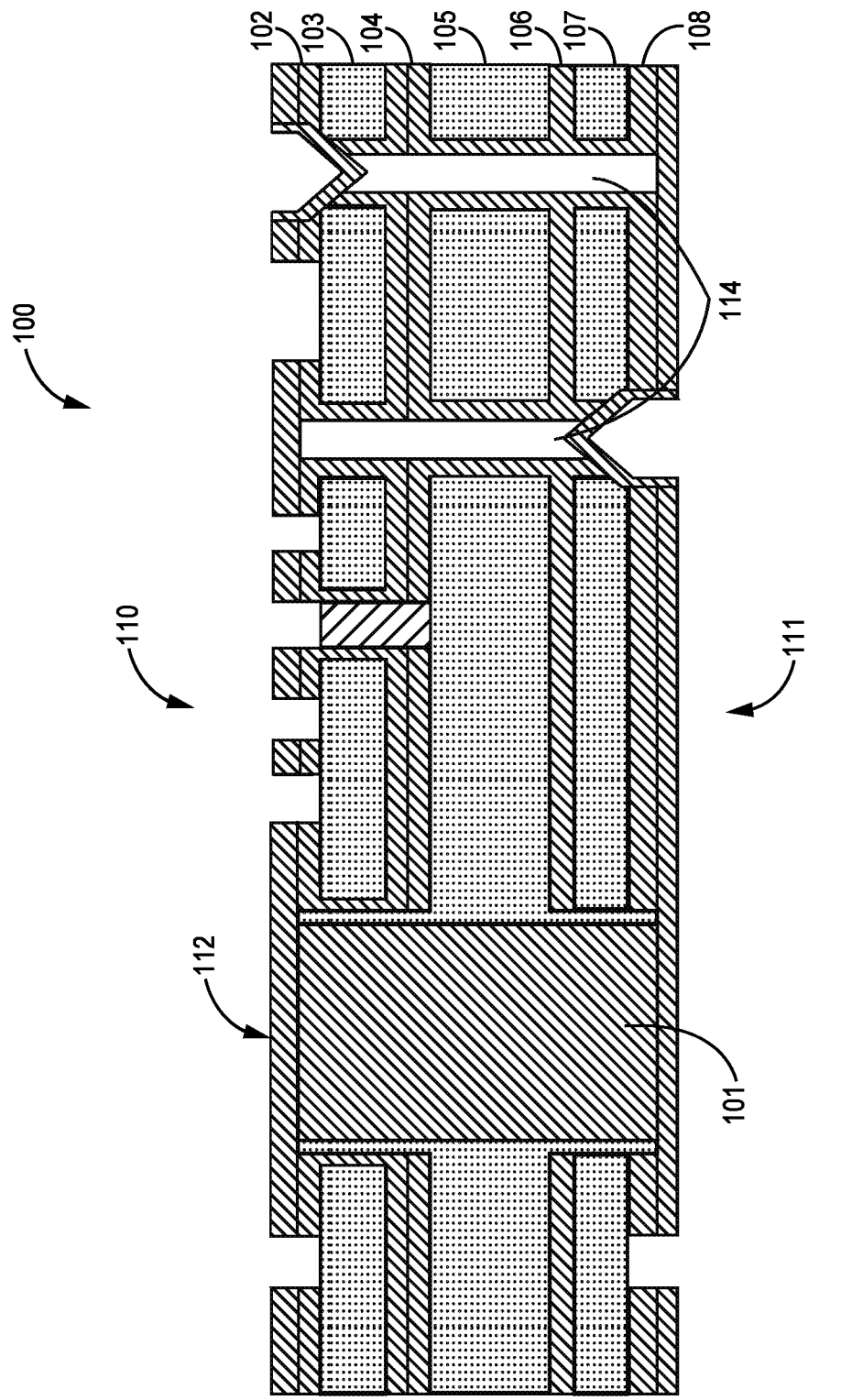
FIG. 1 is a cross-sectional view of an example PCB that is configured for a bare die mount with an integrated thermal conductive heat body.

FIG. 1 is a cross sectional view of an example PCB 100 that is configured for a bare die mount and utilizes prepreg in the PCB stack as the adhesive for a thermal conductive heat body 101. The PCB 100 includes a plurality of conductive layers 102, 104, 106, 108 and a plurality of non-conductive layers forming a laminated stack. Each conductive layer 102, 104, 106, 108 is composed of an electrically conductive material, typically copper, and patterned to form electrically conductive interconnects. The conductive layers 102, 104, 106, 108 are separated by a respective insulating (non-conductive) layer 103, 105, 107. It is noted that the number of non-conductive layers and conductive layers shown in FIG. 1 is merely a design choice and that fewer or greater numbers of non-conductive layers and conductive layers can be used.

Each non-conductive layer is made of a non-conductive material. The PCB 100 of FIG. 1 is shown after final lamination, so each non-conductive layer 103, 105, 107 is composed of a fully cured resin. Prior to lamination, the non-conductive material of the non-conductive layers 103, 105, 107 can be a prepreg or a base material. Prepreg is a fibrous reinforcement material impregnated or coated with a resin binder and consolidated and partially cured to an intermediate semi-solid product. The resin in prepreg is only partially cured and therefore flows during lamination. After being sufficiently heated during a lamination process, the resin in prepreg cools into a fully cured state. Base material is composed of a fully cured resin and as such does not flow during lamination.

The PCB 100 defines a mounting face 110 and a backside 111. The mounting face 110 is an exposed face of the PCB 100 that functions as the primary surface on which one or more components are mounted to the PCB. The mounting face 110 defines one or more bond pads or the like onto which one or more components can be mounted, such as one or more bare dies, packaged ICs, heat sinks, or electrical connectors. The backside 111 is an exposed face of the PCB 100 that is reverse of the mounting face 110. The backside 111 of the PCB 100 can be mounted to a heat sink, cool ribbon or other heat removal structure.

The thermal conductive heat body 101 is a heat conductive material that extends from a bond pad 112 on the mounting face 110 to the backside 111 of the PCB 100. The thermal conductive heat body 101 can extend laterally underneath most of the surface of the bond pad 112 in order to provide a large area for heat extraction from the bond pad 112. The thermal conductive heat body 101 provides a thermal path for heat from one or more dies mounted on the bond pad 112 to the backside 111 of the PCB 100. The thermal conductive heat body 101 can be composed of any suitable heat conducting material, such as a pure metal (e.g., copper), a thermal ceramic, or a metal alloy like Cu/Mo70Cu/Cu (CPC). The thermal conductive heat body 101 can have any suitable geometry such as cylindrical, square, rectangular, and/or can have one or more flanges extending from a central body. The bond pad 112 over the thermal conductive heat body 101 can be defined in the first conductive layer 102 of the PCB 100 as shown in the example of FIG. 1 or can be a recessed bond pad defined in a different conductive layer 104, 106, 108. PCB 100 can also define one or more vias 114 extending therethrough.

FIGS. 2-11 are cross-sectional views of example stages during a method of fabrication of the PCB 100. The method shown in FIGS. 2-11 is described in relation to the PCB 100 with embedded thermal conductive heat body 101 of FIG. 1. Similar methodologies can be applied to fabricate similar circuit boards with embedded thermal conductive heat body(s).

Figure 2:
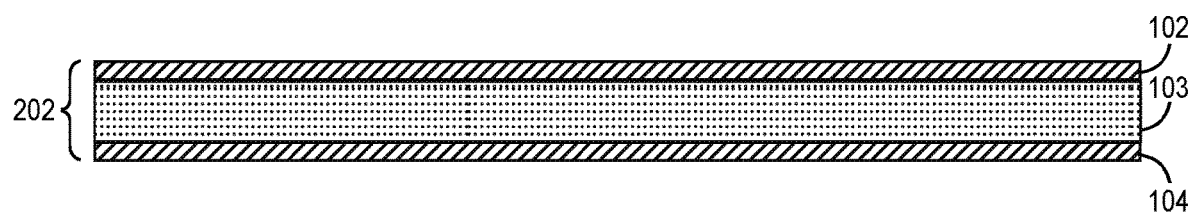
FIGS. 2-11 are cross-sectional views of stages in an example fabrication process of the PCB of FIG. 1.

In FIG. 2, appropriate layers are stacked to form the first conductive layer 102, non-conductive layer 103, and second conductive layer 104, collectively referred to as the top section stack-up 202. The top section stack-up 202 can include a single non-conductive layer 103 with respective conductive layers 102, 104 on each side as is shown in FIG. 1 or non-conductive layer 103 can instead be a multi-layer stack made of one or more conductive layers and multiple non-conductive layers. It should be understood that references to "top", "bottom", "back", and the like are used in reference to the example orientation shown in the Figures, however, the PCB 100 can have any orientation. In an example, the top section stack-up 202 includes a core, such that at least one non-conductive layer therein is base material. In an alternative example, all one or more non-conductive layers in the top section stack-up are prepreg. The conductive layers 102, 104 are each electrically conductive layers made of a metal, such as copper (e.g., a copper foil sheet), that are patterned into electrically conductive traces, or interconnects. In this example, the "bottommost" layer of the top section stack-up 202 is a conductive layer 104, however, in other examples the bottommost layer can be a non-conductive layer.

Figure 3:
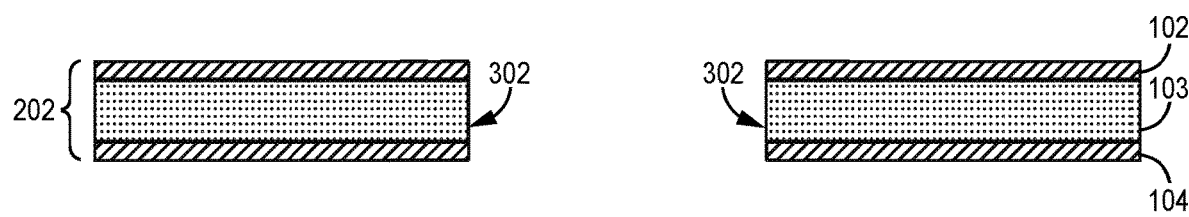

In FIG. 3, a first cutout 302 is formed in the top section stack-up 202. The first cutout 302 is sized to fit the cross-section of the thermal conductive heat body 101 therein. In an example, the first cutout 302 is sized to account for one or more layers of plating (FIG. 4) being applied to the sidewalls of the cutout 302. That is, the first cutout 302 is sized such that after one or more layers of plating are applied to the sidewalls, the cross-section of the thermal conductive heat body 101 fits therein. In some examples, the first cutout 302 is formed by milling. It is understood that other techniques can be used to form first cutout 302, such as laser ablation.

Figure 4:
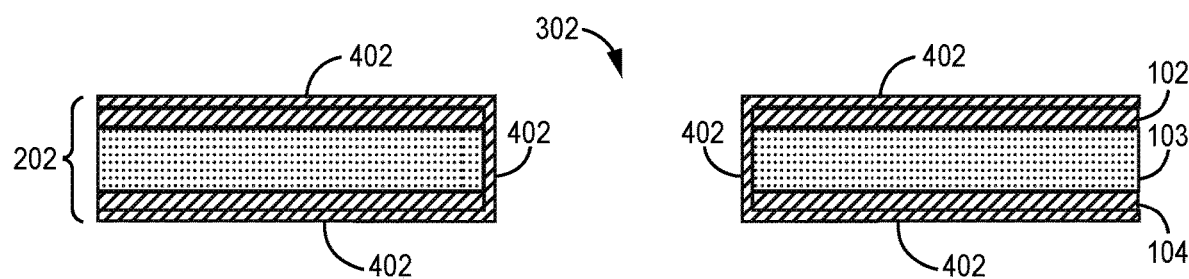

In FIG. 4, a first electrically conductive plating 402 is applied to the top and bottom surfaces of the top section stack-up 202. Specifically, the first plating 402 is applied over the first conductive layer 102 and the second conductive layer 104. The first plating 402 is also applied onto the side walls of the first cutout 302. The first plating 402 on the side walls electrically couples areas of the first conductive layer 102 that are adjacent the first cutout 302 to areas of the second conductive layer 104 that are adjacent the first cutout 302. In an example, the first plating 402 is copper. In alternative examples, plating is not applied to the top-section stack-up 202.

Figure 5:
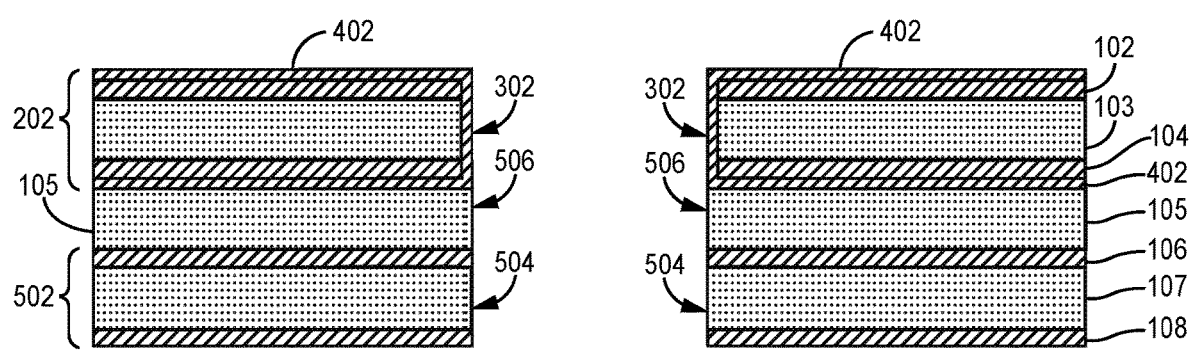

In FIG. 5, additional layers with appropriate cut-outs are added to the stack-up. In an example, the additional layers include a bottom section stack-up 502 and a non-conductive layer 105 of prepreg. The bottom section stack-up 502 can include a single non-conductive layer 107 with respective conductive layers 106, 108 on each side as is shown in FIG. 5 or non-conductive layer 107 can instead be a multi-layer stack made of one or more conductive layers and multiple non-conductive layers. In this example, the bottom section stack-up 502 includes the third conductive layer 106, the non-conductive layer 107, and the fourth conductive layer 108. The bottom section stack-up 502 can include a second core, such that at least one non-conductive layer therein is base material. In an alternative example, all one or more non-conductive layers in the bottom section stack-up 502 are prepreg. The conductive layers 106, 108 are each electrically conductive layers made of a metal, such as copper, that are patterned into electrically conductive traces, or interconnects. In this example, the "top" most layer of the bottom section stack-up 502 is a conductive layer 108, however, in other examples the topmost layer can be a non-conductive layer.

A second cutout 504 is formed in the bottom section stack-up 504. The second cutout 504 is sized to fit the thermal conductive heat body 101 therein. In some examples, the second cutout 504 is formed by milling. It is understood that other techniques can be used to form second cutout 504, such as laser ablation. In the example shown herein, the second cutout 504 is not plated and the second cutout 504 is sized to fit the thermal conductive heat body 101 without plating applied to the sidewalls. In other examples, the second cutout 504 is plated and it is sized accordingly.

The non-conductive layer 105 of prepreg can be disposed between the top section stack-up 202 and the bottom section stack-up 502. In particular, the non-conductive layer 105 of prepreg can be disposed to contact the bottommost layer of the top section 202 (conductive layer 104 in this example) and the topmost layer of the bottom section 502 (conductive layer 106 in this example). The non-conductive layer 105 includes a third cutout 506 that is sized to fit the thermal conductive heat body 101 therein. In some examples, the third cutout 506 is formed in the non-conductive layer 105 prior to stack-up. In this case, the non-conductive layer 105 is stacked with the top section 202 and bottom section 502 such that the third cutout 506 aligns with the first cutout 202 and the second cutout 504. In another example, an uncut non-conductive layer 105 of prepreg can be added to the bottom section 502 and the third cutout 506 can be made simultaneously with the second cutout 504.

In some examples, more or fewer than two cores are included in the stack-up. For example, a third core can be included in the stack-up with a respective non-conductive layer of prepreg disposed between each respective core. In some examples, the cutout for the thermal conductive heat body 101 is formed after final stack-up. For example, the top section 202, bottom section 502, and non-conductive layer 105 of prepreg can stacked and then a cutout is made through all layers simultaneously.

Figure 6:
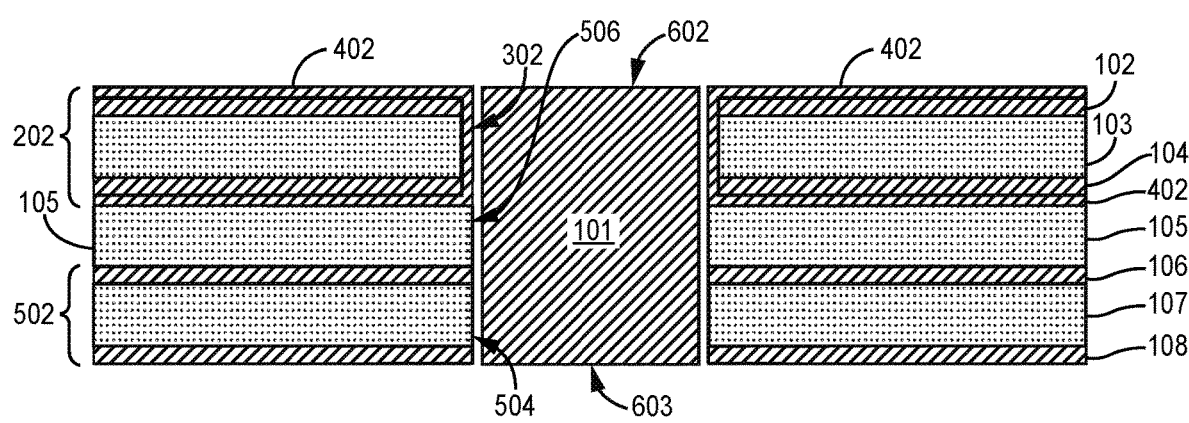

In FIG. 6, the thermal conductive heat body 101 is inserted into the cutouts 302, 504, 506, such that the surfaces 602, 603 of the thermal conductive heat body 101 are generally aligned with the outer conductive layers 102, 108. To insert the thermal conductive heat body 101, the stack-up is placed on a solid surface, such as a steel plate and the thermal heat body 101 is placed into the cutouts 302, 504, 506. The solid surface keeps the thermal heat body 101 in place and aligned within the stack-up.

Figure 7:
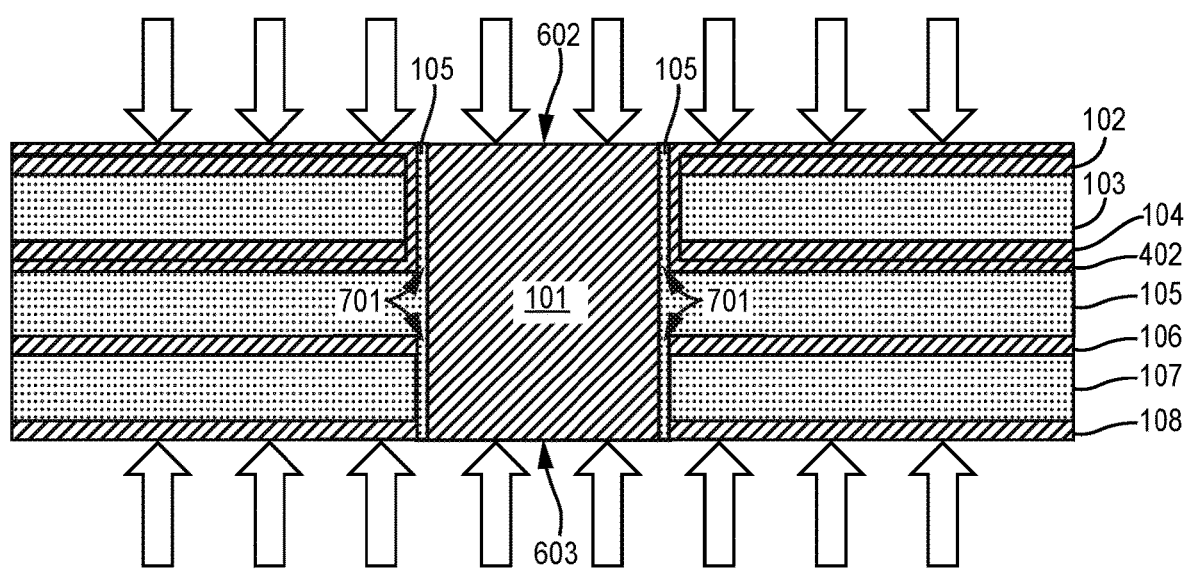

In FIG. 7, the stack-up with the thermal conductive heat body 101 included therein is laminated. Another solid surface, such as a second steel plate is placed overtop of the stack-up with the thermal conductive heat body 101 therein. Heat and pressure are applied to the stack-up with the solid surfaces to laminate the stack-up together. During lamination resin in any non-conductive layer(s) that are not fully cured (prepreg layers) flows 701 into the space between the walls of the cutout and the thermal conductive heat body 101. This material flow 701 can be from the non-conductive layer 105 of prepreg as well as any non-conductive layers elsewhere in the stack-up that are not fully cured. In the example of FIG. 7, non-conductive layers 103 and 107 are base material (fully cured) as part of a core, such that non-conductive layer 105 is the only layer with partially cured resin (prepreg). In other examples, other or additional layers in the stack-up can include prepreg. For example, the top and/or bottom non-conductive layer can be prepreg that flows into the space between the walls of cutout and the thermal conductive heat body 101 in other examples.

The material flow 701 from the prepreg into the cutout during lamination provides adhesive to bond the thermal conductive heat body 101 to the layers of the PCB 100. Additionally, since this material flow 701 functions as the bonding agent for the thermal conductive heat body 101, a separate adhesive need not be used to secure the thermal conductive heat body 101. This reduces processing steps, which can save time and money and also provides a better bond between the thermal conductive heat body 101 and the layers of the PCB 100, because the bonding agent is integral with the prepreg non-conductive layer(s) of the PCB 100 from which the material flowed. That is, the bonding agent for the thermal conductive heat body 101 and at least one non-conductive layer of the PCB 101 are a monolithic structure.

Advantageously, integrating the thermal conductive heat body 101 prior to final curing of the prepreg in the stack-up enables the cutout for the thermal conductive heat body 101 to be formed with a tighter fit than if the conductive heat body 101 were installed after final curing of the prepreg. This is because less space between the conductive heat body 101 and the walls of the cutout are needed to accommodate adhesive. That is, if the conductive heat body 101 is inserted after final curing of the prepreg as is done in prior PCBs, the cutout(s) for the conductive heat body 101 must be slightly larger to provide room to get adhesive into the space between the conductive heat body 101 and the walls of the cutout(s). In the fabrication process described herein, however, the bonding agent for the conductive heat body 101 comes from the prepreg non-conductive layers of the stack-up. Thus, no extra space is needed to allow additional adhesive to be inserted.

Additionally, incorporating the thermal conductive heat body 101 prior to final curing of the prepreg can also improve the coplanarity of the exposed surface(s) 602, 603 of the thermal conductive heat body 101 to the adjacent outer surfaces of the stack-up. This is due to conformal filling around the thermal conductive heat body 101 by resin flow during lamination and the ability of the prepreg flows to compress to a thickness such that the outer surfaces of the stack-up are co-planar with the exposed surfaces 602, 603 of the thermal conductive heat body 101. The conformal filling allows the resin to conform to the shape and thickness of the thermal conductive heat body 101 and enables micro-spaces to be filled, which reduces gaps around the perimeter of the thermal conductive heat body 101 and provides better surfaces for the post-lamination plating.

Figure 8:
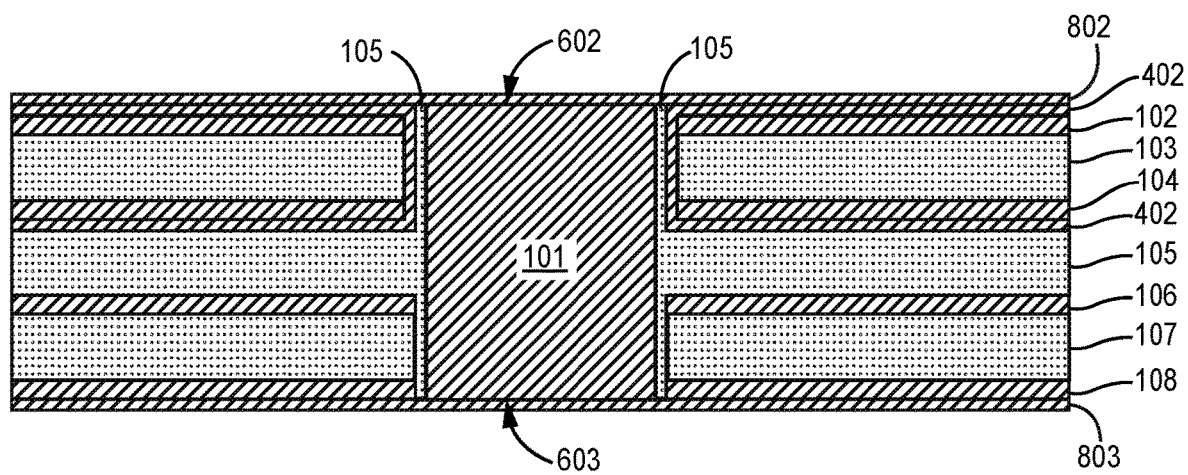

In FIG. 8, plating is applied to the top and bottom surfaces of the laminated stack of FIG. 7. Specifically, a second plating 802 is applied over the first conductive layer 102. This second plating 802 also covers the exposed surface 602 of the thermal conductive heat body 101 adjacent the first conductive layer 102. The second plating 802 couples the thermal conductive heat body 101 to the first conductive layer 102 and the second conductive layer 104 by virtue of the first plating 402 on the sidewalls of the first cutout 302. A third plating 804 is applied over the fourth conductive layer 108. This third plating 804 also covers the exposed surface 603 of the thermal conductive heat body 101 adjacent the fourth conductive layer 108. The third plating 804 couples the thermal conductive heat body 101 to the fourth conductive layer 108. In an example, the second plating 802 and third plating 804 are copper.

Figure 9:
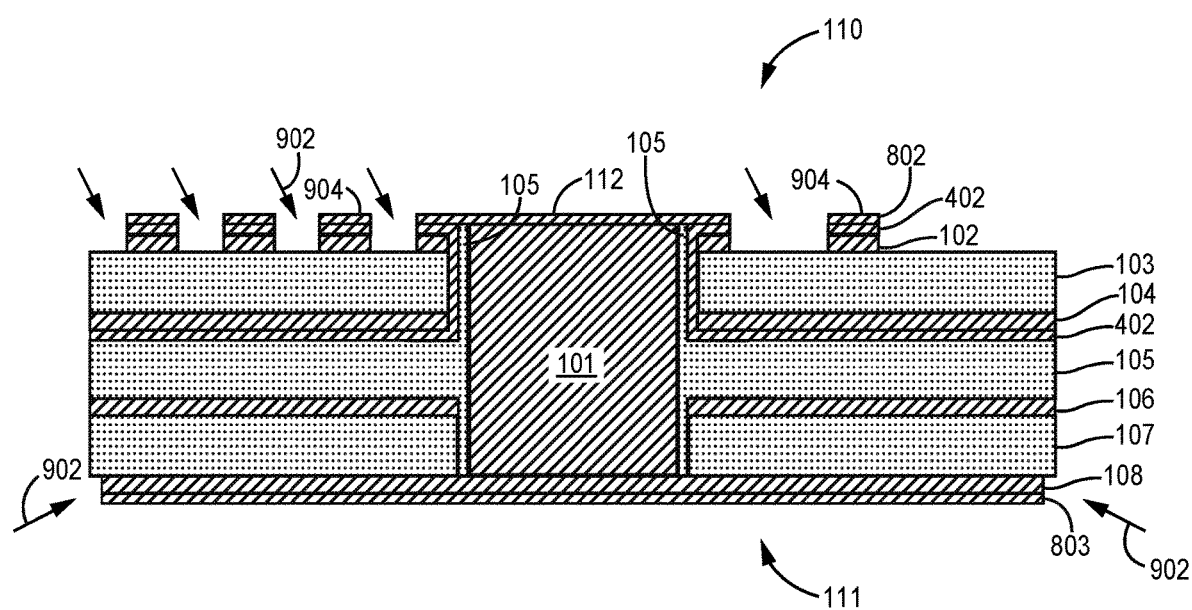

In FIG. 9, the outer layers of the laminated stack are etched 902. Outer layer etching 902 can be performed on the outer conductive layers 102, 108 of the mounting surface 110 and the backside 111 of the PCB 100. The outer layer etching 902 can define the die bond pad 112 on the mounting surface 110 of the PCB 100 above the thermal conductive heat body 101, such that a die can be attached to the mounting surface 110 on top of the thermal conductive heat body 101. The outer layer etching 902 can also define a plurality of wire bond pads 904 on the mounting surface 110 adjacent the die bond pad 112. The wire bond pads 904 are configured to have a bond wire attached between the wire bond pad 904 and the die.

Figure 10:
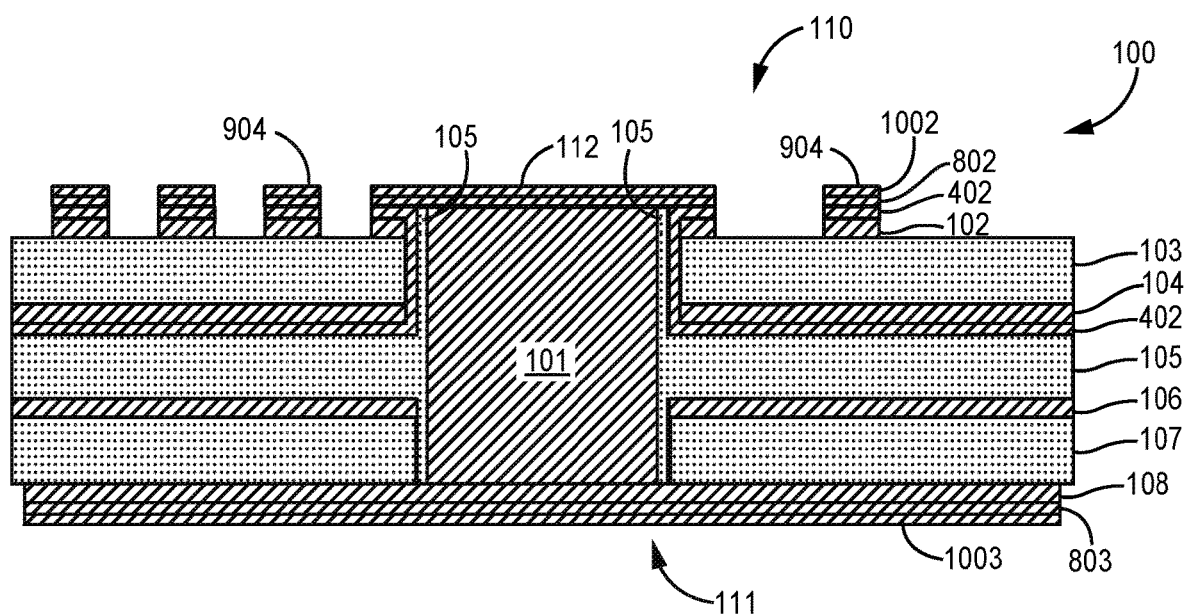

In FIG. 10, one or more layers of finish plating 1002, 1003 are applied. The finish plating 1002, 1003 can be applied over exposed plating 802, 803 and is configured to prevent oxidation and to improve wire bonding and/or soldering to the wire bond pads 904. In an example, the finish plating 1002, 1003 is configured for wire bonding thereto. One manner in which the finish plating 1002, 1003 can be configured for wire bonding is for the finish plating 1002, 1003 to include at least one layer of palladium to aid in gold wire bonding thereto. In an example, the finish plating 1002, 1003 is an electroless nickel+electroless palladium+immersion gold (ENEPIG) plating. Such an ENEPIG plating includes a layer of nickel covered with a layer of palladium, which is covered with a layer of gold. In other examples, the finish plating 1002, 1003 does not include nickel and can include other combinations of various finishes used in PCB processing that promote wire bonding or soldering. In some examples, a different finish plating 1003 can be applied on the backside 111 as compared to the front face 110, if there is no wire bonding that will be done to the backside 111 of the PCB 100.

The plating 802, 803 and finish plating 1002, 1003 can be performed using one or more known plating and finish plating techniques, in either a panel plate process or in a pattern plate process, to achieve the desired overall plating thickness.

Figure 11:
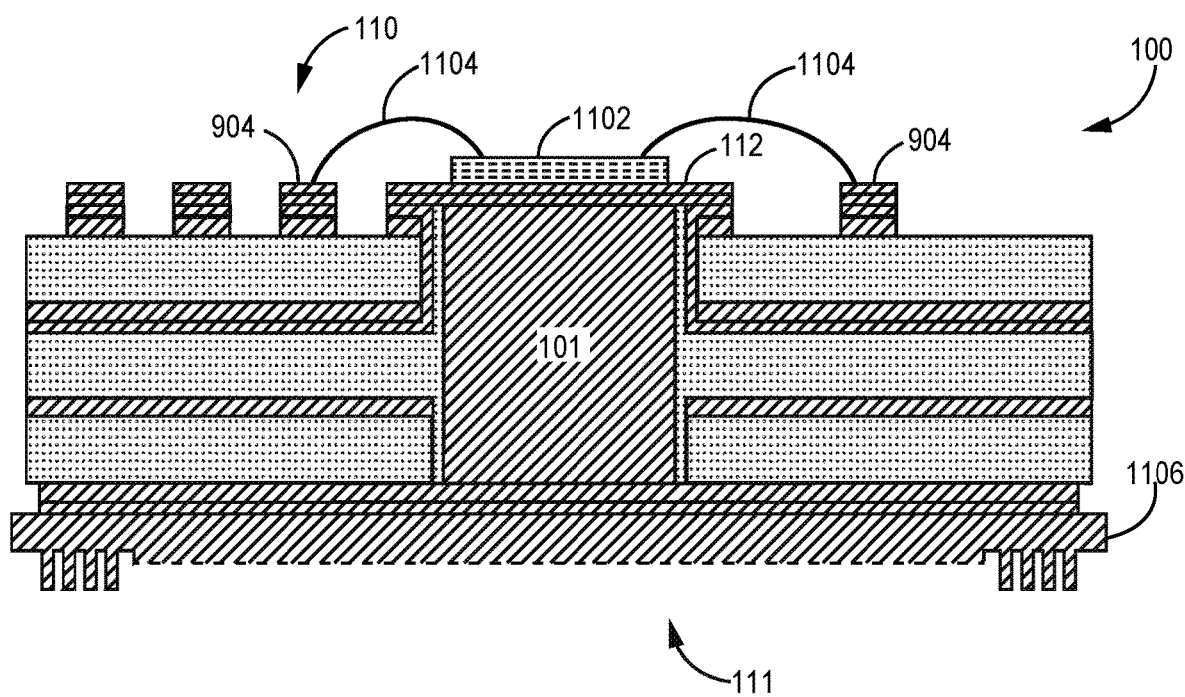

In FIG. 11, a bare die 1102 is mounted to the die bond pad 112 above the thermal conductive heat body 101 on the mounting face 110 of the PCB 100. The bare die 1102 is an unencapsulated die. That is, die 1102 is a diced portion of a fabricated semiconductor substrate that has not been mounted to a flange or lead frame and has no molding compound thereon. Thus, there is no flange or lead frame between the die 1102 and the bond pad 112. Instead, the thermal conductive heat body 101 and PCB 100 function as the flange and/or lead frame for the die 1102.

The bare die 1102 can be attached to the die bond pad 112 using a conductive adhesive. The PCB 100 is configured to have a bare die mounted on the die bond pad 112 via the incorporation of the thermal conductive heat body 101 for dissipating heat from the die 112 and the incorporation of finish plating 1002 on the wire bond pads 904 that is configured for wire bonding. Bond wires 1104 can be connected to the die 1102 and the wire bond pads 904 adjacent the die bond pad 112. Bond wires 1104 can be composed of any suitable material such as gold or aluminum and can be bonded using any suitable technique such as ultrasonic or thermosonic bonding. After the bare die 1102 is mounted and wire bonded to the PCB 100, molding compound or a cap for shielding (neither are shown) can be placed around the bare die 1102 and bond wires 1104. In some examples, a heat sink 1106 or the like can be mounted to the backside 111 of the PCB 100. Any known technique for mounting a heat sink to a circuit board can be used including, but not limited to, adhesive, past, solder, compression, and/or mechanical means such as using appropriate fasteners.

As discussed above, the incorporation of the thermal conductive heat body 101 into the PCB 100 prior to final curing of the prepreg in the stack-up enables the cutout to have a smaller size because the cutout does not need to accommodate additional adhesive for the thermal conductive heat body 101. This reduced size enables the wire bond pads 904 to be disposed closer to the die bond pad 112, which in turn allows for reduced length of the bond wires 1104.

Figure 12:
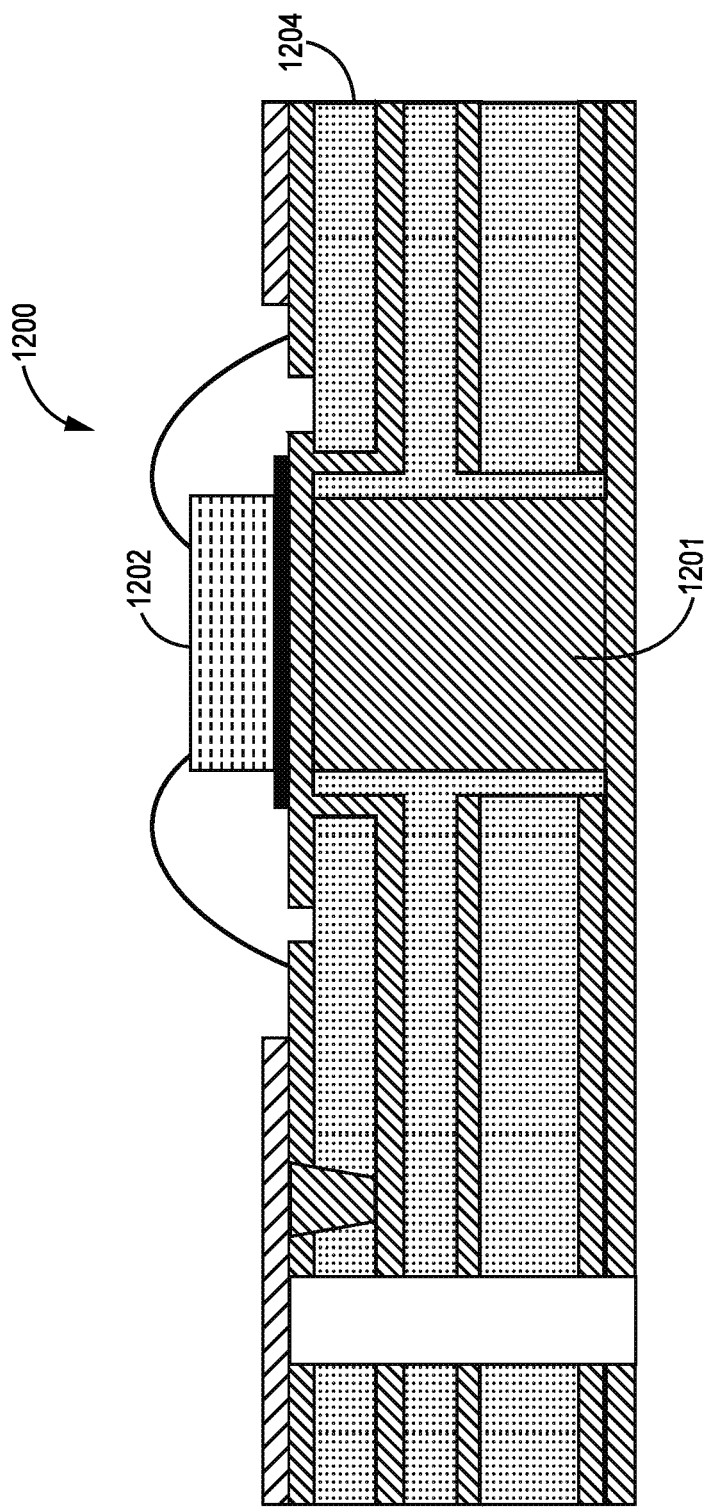
FIG. 12 is a cross-sectional view of another example PCB that is configured for a bare die mount with an integrated thermal conductive heat body.

FIG. 12 is a cross sectional view of another example PCB 1200 configured for mounting of a bare die 1202 thereon. PCB 1200 can be fabricated in a similar manner to that described with respect to PCB 100, such that the thermal conductive heat body 1201 is integrated into the PCB 1200 prior to final curing of the prepreg. In contrast to the PCB 100, the top section stack of PCB 1200 includes a core having RF material as its base 1204. Any suitable RF base material can be used, such as a material with a low dissipation factor (Df) and a low dielectric constant (Dk) (e.g., a PTFE or a ceramic).

Figure 13:
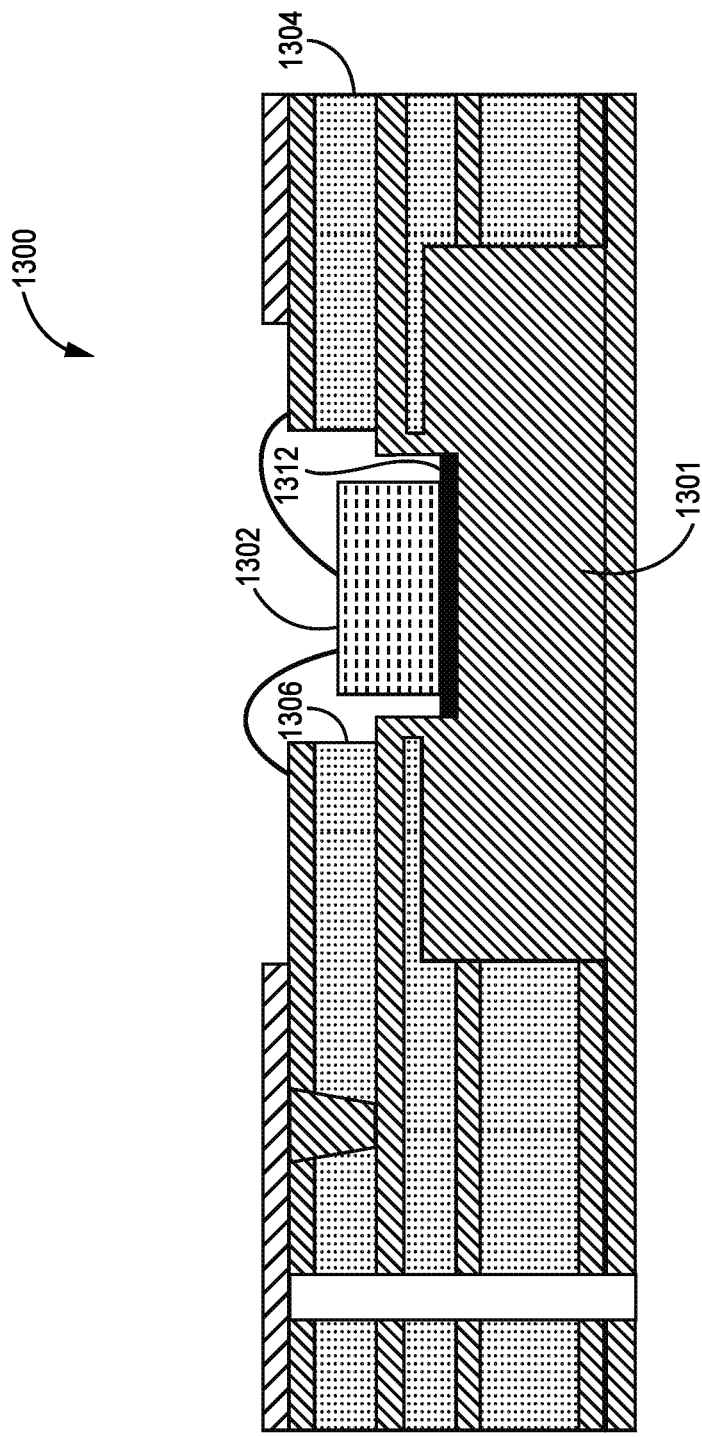
FIG. 13 is a cross-sectional view of yet another example PCB that is configured for a bare die mount in a cavity with an integrated thermal conductive heat body.

FIG. 13 is a cross-sectional view of another example PCB 1300 configured for mounting of a bare die 1302 thereon. PCB 1300 defines a cavity 1306 with the die bond pad 1312 for the bare die 1302 in the cavity. The PCB 1300 can be fabricated in a similar manner to that described with respect to PCB 100, such that the thermal conductive heat body 1301 is integrated into the PCB 1300 prior to final curing of the prepreg. In contrast to the PCB 100, however, the cutout 1306 in the top section stack is sized for placement of the bare die 1302 therein as opposed to being sized for the thermal conductive heat body 1301. A base 1304 of a core for the top section stack can also be RF material. An example process for integrating a thermal conductive heat body into a PCB below a cavity prior to final curing of the prepreg is described in U.S. Pat. No. 10,499,500, which is hereby incorporated herein by reference.

Figure 14:
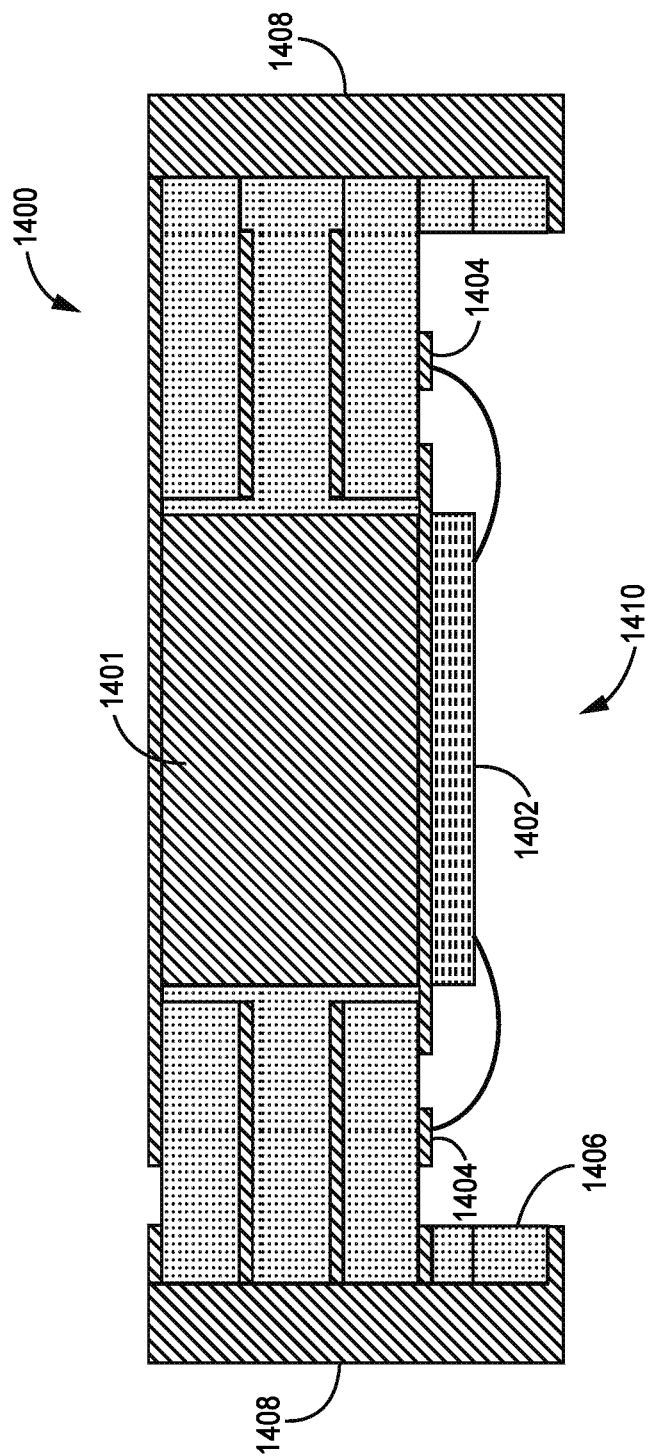
FIG. 14 is a cross-sectional view of still another example PCB that is configured for a bare die mount with an integrated thermal conductive heat body and flip chip mounting of the PCB.

FIG. 14 is a cross-sectional view of yet another example PCB 1400 configured for mounting of a bare die 1402 with an integrated thermal conductive heat body 1401. PCB 1400 is configured for flip chip mounting. PCB 1400 can be fabricated in a similar manner to PCB 1300, however, the cutout 1406 in the top section stack (which is disposed towards the bottom in the "flip chip" illustration of FIG. 14) is sized to accommodate mounting of the bare die 1402 as well as wire bond pads 1404 adjacent the die 1402. The PCB 1400 also includes a plurality of support vias 1408 to provide structural support to enable the PCB 1400 to be mounted via its front face 1410. In an example, the support vias 1408 can be composed of copper.

Figure 15:
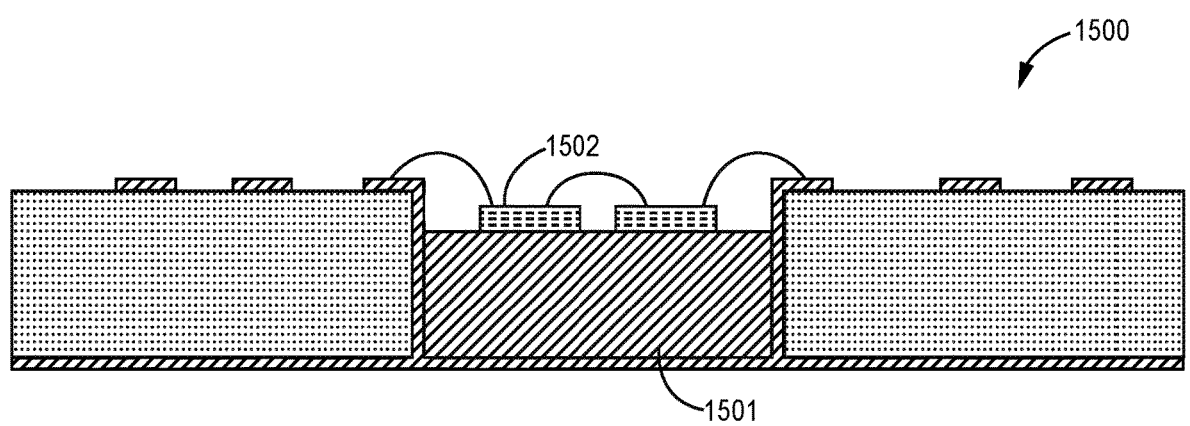
FIG. 15 is a cross-sectional view of yet another example PCB that is configured for multiple bare die mounts with an integrated thermal conductive heat body.

FIG. 15 is a cross-sectional view of still another example PCB 1500 configured for mounting of multiple bare dies 1502 thereon. The PCB 1500 can be fabricated in a similar manner to that described with respect to PCB 100 except thermal conductive heat body 1501 has a height less than the thickness of the PCB 1500 and is large enough for multiple bare dies 1502 to be mounted thereon. Although not shown, the PCB 1500 can include multiple conductive and non-conductive layers as described in the example PCBs above.

Figure 16:
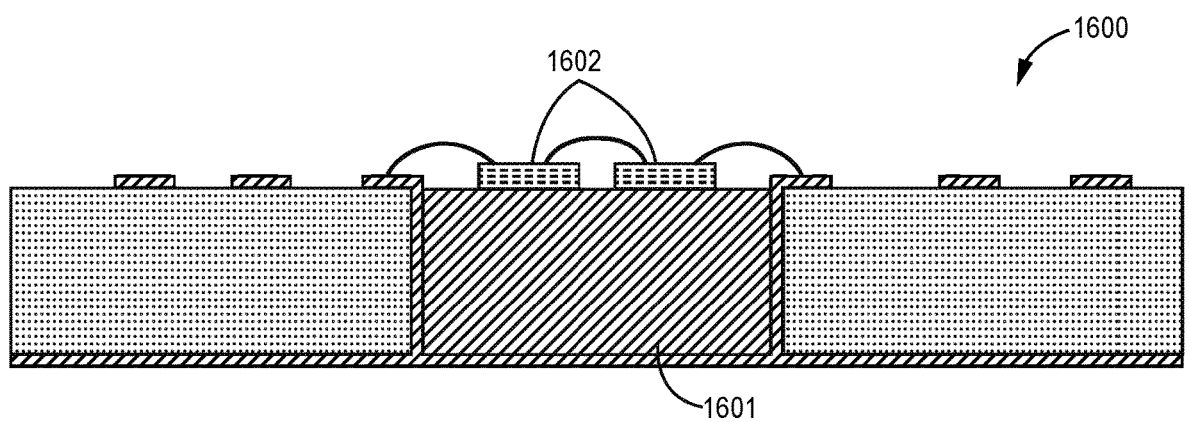
FIG. 16 is a cross-sectional view of yet another example PCB that is configured for multiple bare die mounts with an integrated thermal conductive heat body.

FIG. 16 is a cross-sectional view of yet another example PCB 1600 configured for mounting of multiple bare dies 1602 thereon. The PCB 1600 can be fabricated in a similar manner to that described with respect to PCB 100 except thermal conductive heat body 1601 is large enough for multiple bare dies 1602 to be mounted thereon. Although not shown, the PCB 1600 can include multiple conductive and non-conductive layers as described above.

Figure 17:
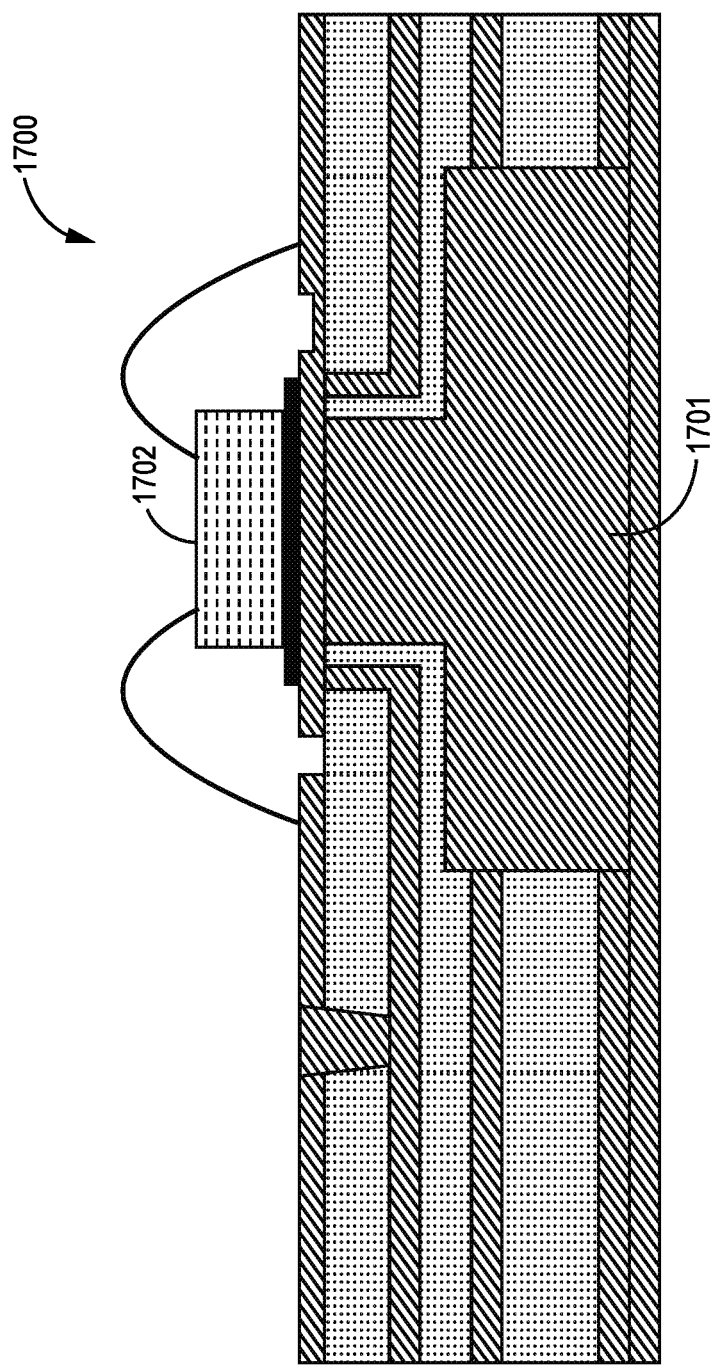
FIG. 17 is a cross-sectional view of yet another example PCB configured for mounting of a bare die with a thermal conductive heat body having a flanged geometry.

FIG. 17 is a cross-sectional view of yet another example PCB 1700 configured for mounting of a bare die 1702 with a thermal conductive heat body 1701 having a flanged geometry. Such a flanged geometry can have a 'T' shape with a flange that extends outward proximate the mounting face and/or backside of the PCB 1700 to act as a larger surface for contacting the thermal conductive heat body 1701 (e.g., for a heat sink on the backside of the PCB 1700). In such an example, the cutouts in the layers are sized to correspond to the geometry of the thermal conductive heat body 1701 at that layer. For example, the top section stack of the PCB 1700 can have a smaller cutout for the top portion of the heat body 1701 and the bottom section stack of the PCB 1700 can have a larger cutout for the bottom portion of the heat body 1701.

Although the examples herein illustrate a single die bond pad (whether for a single die or for multiple dies) and a single thermal conductive heat body, any of the example PCBs described herein can have multiple die bond pads with multiple corresponding thermal conductive heat bodies and wire bond pads, each of which is configured for mounting of a respective one or more bare dies. In some examples, multiple PCB modules can be fabricated simultaneously as part of a single panel. That is, a larger single panel PCB can be fabricated having multiple resulting PCB modules thereon. After completion of the PCB build-up (e.g., after finish plating or after mounting and encapsulation of bare dies), the larger panel PCB can be separated into multiple individual PCB modules for use in downstream manufacturing.

The example PCBs configured for bare die mounting with an integrated thermal conductive heat body are especially beneficial for any bare die that produces large amounts of heat to be dissipated. This include bare dies including discrete components such as an RF amplifier where the thermal conductive heat body is coupled to the drain for use as a ground and for heat dissipation. With a bare die mounted directly to a PCB having an integrated thermal conductive heat body as described herein, the thermal conductive heat body in the PCB acts as the flange for the die.

What is claimed is:

1. A circuit board comprising:
    a plurality of electrically conductive layers and a plurality of electrically non-conductive layers in a laminated stack, the laminated stack defining a front face and a back face;
    a thermal conductive heat body extending from a die bond pad on the front face to an electrically conductive layer on the back face, the die bond pad configured for a bare die to be mounted thereon;
    a bonding agent disposed around the thermal conductive heat body adhering the thermal conductive heat body to walls of an opening of the laminated stack, wherein the bonding agent and at least one of the plurality of electrically non-conductive layers are a monolithic structure; and
    a plurality of wire bond pads on the front face adjacent to the die bond pad, the plurality of wire bond pads having a surface finish material thereon, wherein the surface finish material is configured for wire bonding thereto.
2. The circuit board of claim 1, comprising:
    a bare die adhered to the first bond pad.
3. The circuit board of claim 2, wherein the thermal conductive heat body is composed of copper.
4. The circuit board of claim 2, wherein the die bond bad pad is recessed below an outer conductive layer proximate the front face.
5. The circuit board of claim 2, comprising:
    multiple bare dies adhered to the die bond pad.
6. The circuit board of claim 2, comprising:
    a second thermal conductive heat body extending from a second die bond pad on the front face to the electrically conductive layer on the back face, the second die bond pad configured for a bare die to be mounted thereon;
    a bonding agent disposed around the second thermal conductive heat body adhering the second thermal conductive heat body to walls of an opening of the laminated stack, wherein the bonding agent and at least one of the plurality of electrically non-conductive layers are a monolithic structure; and
    a plurality of second wire bond pads on the front surface adjacent to the second die bond pad, the plurality of second wire bond pads having a surface finish material thereon, the surface finish material configured for wire bonding thereto.
7. The circuit board of claim 2, wherein the plurality of electrically conductive layers includes at least three electrically conductive layers.
8. The circuit board of claim 2, wherein the plurality of conductive layers and the plurality of non-conductive layers include a first core laminated to a second core.
9. The circuit board of claim 2, wherein the plurality of conductive layers and the plurality of non-conductive layers include a core having a base of RF material.
10. The circuit board of claim 2, wherein the plurality of conductive layers and the plurality of non-conductive layers define a cavity, wherein the die bond pad is disposed within the cavity.
11. The circuit board of claim 2, wherein the plurality of conductive layers and the plurality of non-conductive layers define a cavity, wherein the die bond pad and a plurality of wire bond pads adjacent to the die bond pad are disposed within the cavity.
12. A method of fabricating a circuit board comprising:
    forming a stack-up with an opening for a thermal conductive heat body, wherein the stack-up includes a plurality of electrically conductive layers and a plurality of electrically non-conductive layers, wherein the plurality of electrically non-conductive layers include at least one layer of prepreg;
    inserting the thermal conductive heat body into the opening;
    laminating the stack-up with the thermal conductive heat body in the opening forming a laminated stack defining a front face and a back face such that the thermal conductive heat body is exposed at the front face and the back face, wherein during laminating the stack-up, resin in the at least one layer of prepreg flows between the thermal conductive heat body and walls of the opening to adhere the thermal conductive heat body into the opening;
    plating the front face and the back face with an electrically conductive plating to couple the thermal conductive heat body to one or more of the plurality of conductive layers; and
    plating a plurality of wire bond pads on the front face adjacent to the thermal conductive heat body with a surface finish material that is configured for wire bonding thereto.

13. The method of claim 12, comprising:
mounting a bare die to a die bond pad defined over the thermal conductive heat body.

14. The method of claim 13, comprising:
bonding a plurality of bond wires to the bare die and the wire bond pads.

15. The method of claim 13, wherein forming a stack-up includes stacking a first core and a second core with a layer of prepreg between the first core and the second core, wherein the first core includes a first conductive layer on a first side and second conductive layer on a second side and the second core includes at least one conductive layer.

16. The method of claim 13, wherein forming a stack-up includes forming a stack-up having at least a portion of a second opening for a cavity for a die bond pad.

17. The method of claim 16, wherein the at least a portion of the second opening is wider than the opening for the thermal conductive heat body.

18. A circuit board comprising:
a plurality of electrically conductive layers and a plurality of electrically non-conductive layers in a laminated stack, the laminated stack defining a front face and a back face;
a thermal conductive heat body extending from a die bond pad on the front face to an electrically conductive layer on the back face, the die bond pad configured for a bare die to be mounted thereon;
a bonding agent disposed around the thermal conductive heat body adhering the thermal conductive heat body to walls of an opening of the laminated stack, wherein the bonding agent and at least one of the plurality of electrically non-conductive layers are a monolithic structure; and
a bare die adhered to the first bond pad.

19. The circuit board of claim 18, wherein the die bond pad is recessed below an outer conductive layer proximate the front face.

20. A method of fabricating a circuit board comprising:
forming a stack-up with an opening for a thermal conductive heat body, wherein the stack-up includes a plurality of electrically conductive layers and a plurality of electrically non-conductive layers, wherein the plurality of electrically non-conductive layers include at least one layer of prepreg;
inserting the thermal conductive heat body into the opening;
laminating the stack-up with the thermal conductive heat body in the opening forming a laminated stack defining a front face and a back face such that the thermal conductive heat body is exposed at the front face and the back face, wherein during laminating the stack-up, resin in the at least one layer of prepreg flows between the thermal conductive heat body and walls of the opening to adhere the thermal conductive heat body into the opening;
plating the front face and the back face with an electrically conductive plating to couple the thermal conductive heat body to one or more of the plurality of conductive layers; and
mounting a bare die to a die bond pad defined over the thermal conductive heat body.

21. The method of claim 13, comprising:
wire bonding a plurality of bond wires to the bare die and wire bond pads adjacent to the bare die.

* * * * *

UNITED STATES PATENT AND TRADEMARK OFFICE
CERTIFICATE OF CORRECTION

| | |
|---|---|
| PATENT NO. | : 11,160,160 B1 |
| APPLICATION NO. | : 16/986497 |
| DATED | : October 26, 2021 |
| INVENTOR(S) | : Jan Hendrik Berkel |

It is certified that error appears in the above-identified patent and that said Letters Patent is hereby corrected as shown below:

In the Claims

Claim 4 at Column 10, Lines 1-3, should read as follows:
4. The circuit board of claim 2, wherein the die bond pad is recessed below an outer conductive layer proximate the front face.

Signed and Sealed this
Eleventh Day of October, 2022

Katherine Kelly Vidal
*Director of the United States Patent and Trademark Office*